United States Patent [19]

Takagi et al.

[11] 4,066,527

[45] Jan. 3, 1978

[54] METHOD OF PRODUCING SEMICONDUCTOR DEVICE

[75] Inventors: Toshinori Takagi, Nagaokakyo; Kiyoshi Morimoto; Yukihiko Utamura, both of Mobara, all of Japan

[73] Assignee: Futaba Denshi Kogyo K. K., Japan

[21] Appl. No.: 705,713

[22] Filed: July 15, 1976

[30] Foreign Application Priority Data

July 18, 1975 Japan .................................. 50-87255
July 18, 1975 Japan .................................. 50-87256

[51] Int. Cl.² ........................................... C23C 15/00
[52] U.S. Cl. .......................... 204/192 N; 136/89 TF; 148/175; 156/610; 427/39; 427/82; 427/84; 427/86
[58] Field of Search ............... 204/192 N; 427/39, 84, 427/82, 40, 86; 29/572, 590; 148/175; 156/610

[56] References Cited

U.S. PATENT DOCUMENTS 3,370,980  2/1968  Anderson ............................. 117/227
3,968,019  7/1976  Hanazono et al. .................... 204/192

OTHER PUBLICATIONS

S. Aisenberg et al., "Physics of Ion Plating & Ion Beam Deposition", J. Vac. Sci. Tech., vol. 10, No. 1, Jan.-/Feb. 1973, pp. 104–107.

L. B. Leder, "Fundamental Parameters of Ion Plating," *Metal Finishing,* Mar. 1974, pp. 41–45.

*Primary Examiner*—John H. Mack
*Assistant Examiner*—Aaron Weisstuch
*Attorney, Agent, or Firm*—Oblon, Fisher, Spivak, McClelland & Maier

[57] ABSTRACT

A method of producing a semiconductor device comprising the step of forming a laminated element film on a substrate made of a material easy to cleave and easy to dissolve in various solvents such as water by successively depositing materials of the laminated element film on the substrate by what is called the ionized-cluster-deposition process so that crystalline film layers oriented by the crystal axis of the substrate material may be made to grow on the substrate, separating the laminated element film from the substrate by dissolving the substrate material in a solvent, and forming the semiconductor device by furnishing the separated laminated element film with suitable electrodes, etc.

14 Claims, 3 Drawing Figures

METHOD OF PRODUCING SEMICONDUCTOR DEVICE

BACKGROUND OF THE INVENTION

The present invention relates to a method of producing a semiconductor device most suitable for use in a thin solar battery.

In a method heretofore employed for producing a semiconductor device for use in a thin solar battery or the like, a semiconductor element is usually formed by polishing a bulk single-crystal of, for instance, silicon (Si). Therefore, in the conventional method, it is very difficult to form a thin film of semiconductor the thickness of which is on the order of microns; and even if such a thin film can be produced, the amount of material that can utilized will be as low as several percent or less of the total. Moreover, even if the conventional evaporation process or sputtering process is employed to produce a thin film, production of a high-quality crystalline film can hardly be expected.

In addition, there has been an urgent need of a high-quality semiconductor device for use in a thin solar battery, light in weight, inexpensive, easy to transport and whose thickness is on the order of microns.

SUMMARY OF THE INVENTION

Therefore, the primary object of the present invention is to provide a method of producing a semiconductor device most suitable for use in a thin solar battery and having a high-quality semiconductor element portion as the essential part thereof.

According to the present invention, there is provided a method of producing a semiconductor device suitable for use in a solar battery comprising the steps of forming a laminated element film portion, which constitutes the essential part of the semiconductor device, on a substrate by successively depositing at least materials of the element portion on a cleavage plane of the substrate made of a material easy to cleave and easy to dissolve in a solvent such as water so that good crystalline layers oriented by the crystal axis of the substrate material may be made to grow on the substrate, by what is called the ionized-cluster-beam deposition process which vaporizes a material-to-be-deposited injects the vapor into a vacuum region of about $10^2$ Torr or less to form aggregates of atoms of the vapor called clusters, bombards the clusters with electrons to ionize at least a part of the clusters thereby forming ionized clusters, and accelerates the ionized clusters by an electric field to bring them into collision with a substrate thereby forming a crystalline layer thereon; isolating the laminated element film of the element portion from the substrate by dissolving the substrate material in the solvent, and furnishing the laminated element film of the element portion with suitable terminal electrodes, etc. to form the semiconductor device.

BRIEF DESCRIPTION OF THE DRAWINGS

Other objects, feartures and adavantages will become more apparent from the following detailed description taken in conection with the accompanying drawings, in which.

DESCRIPTION OF THE PREFERRED EMBODIMENTS

Figure 1:
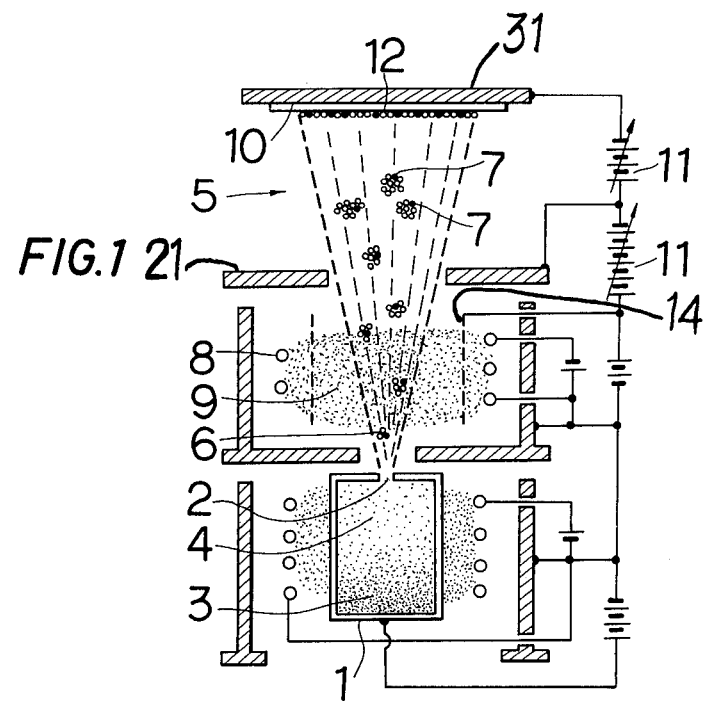
FIG. 1 is a schematical sectional view of an example of the evaporation apparatus for carrying out the method of producing a semiconductor device according to the present invention, showing the principle thereof for explanatory purposes.

Reference is now made to FIG. 1. Description will be made of the ionized-cluster-beam deposition process, and the steps of forming the laminated semiconductor film of the element portion and isolating the element portion.

Reference numeral 1 designates a closed type crucible having at least one injection nozzle 2. A film material 3 is placed in the crucible 1, which is then heated up to an elevataed temperature by suitable heating methods such as resistance heating and electron bombardment (as shown in FIG. 1) to vaporize the material 3 thereby to form a vapor 4 having a pressure of about $10^{-2}$ to several Torrs. The vapor 4 is injected via the nozzle 2 of the crucible 1 into a vacuum region 5 where the pressure is kept at 1/100 or less of that of the vapor 4 in the crucible 1 and, in addition, at about $10^{-2}$ Torr or less to form aggregates of atoms called clusters 6 under the influence of a supercooling phenomenon caused by adiabatic expansion of the vapor 4. One cluster generally consists of about 100 to 2,000 atoms. If one of the atoms of the cluster 6 is ionized, an ionized cluster will be formed. Accordingly, a filament 8 is provided as a thermionic emission source. Electrons 9 emitted from the filament 8 pass through a grid electronic 14 and are brought into collision with the neutral clusters 6 to form ionized clusters 7. The ionized clusters 7 moving towards a substrate 10 together with the neutral clusters 6 are accelerated by an electric field created by acceleration voltage sources 11 connected to the substrate 10 and/or the vicinity thereof and to accelerating electrodes 21 and 31 to come into collision with the substrate which is held by the accelerating electrode 31.

The substrate 10 is preferably made of a material easy to cleave and easy to dissolve in various solvents such as water. Generally speaking, rock salt is most suitable for such a material. Especially, rock salt is very advantageous when the semiconductor to be deposited is silicon, because the lattice misfit between rock salt and silicon (i.e., the difference between their lattice constants) is only 3% and this fact has favorable influence on the crystal growth of silicon.

When the ionized clusters 7 are brought into collision with the substrate 10, most of their kinetic energy is converted into thermal energy which is imparted to the substrate 10 to heat the surface layer of the film depositing thereon. At the same time, the ionized clusters 7 themselves are broken up into individual atomic particles which scatter over the surface of the depositing film layer, by what is called the migration effect, which facilitates the crystal growth. Such a migration effect can be also expected to be produced in the case of the neutral or nonionized clusters 6 reaching the substrate 10 at a speed they have when injected. As mentioned above, since the migration effect occurs at an elevated temperature caused by the heating effect produced by the thermal energy converted from the kinetic energy of the clusters 7, a crystalline film layer oriented by the crystal axis of the substrate 10 can be made to grow on the substrate 10. For instance, a silicon film layer with the (100) plane grows on the (100) plane of rock salt. Thus, the neutral and ionized clusters 6 and 7 impinging on the cleavage plane of the substrate 10 make a single-crystal film layer 12 deposit and grow thereon epitaxially.

By repeatedly carrying out the above-mentioned ionized-cluster-beam deposition process, a p-type silicon film layer and an n-type silicon film layer each corresponding to the single-crystal film layer 12 mentioned above can be deposited on the substrate 10 with either one on top of the other to complete the formation of a laminated semiconductor element film having at least a pair of p-n junction type semiconductor layers.

When a plurality of film layers of different materials are to be deposited on the same substrate in a laminated manner by the above-mentioned ionized-cluster-beam deposition process as mentioned above, a plurality of crucibles, the number of which corresponds to the number of kinds of materials to be deposited, may be provided in the evaporation apparatus which carries out the ionized-cluster-beam deposition process. In this case, if these crucibles are adapted to operate one by one by mechanically and electrically switching from one crucible to another, a high-quality deposited film consisting of a plurality of laminated layers can be most effectively formed. It is just a matter of course that the above-mentioned switching be carried out so that the various conditions of the deposition process such as substrate temperature, ionization condition and ionized cluster acceleration condition may be optimized according to the material to be deposited.

The deposition substrate 10 with the laminated semiconductor element film deposited thereon is immersed in water to dissolve the substrate 10 therein thereby separating the p-n junction type semiconductor element film having very high quality.

Figure 2:
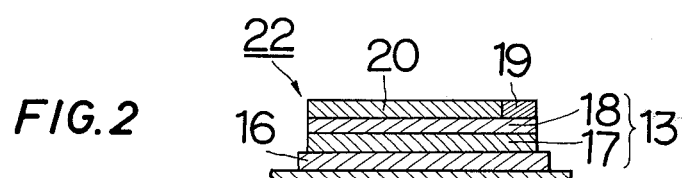
FIG. 2 is a sectional view of an example of a semiconductor device, i.e., the p-n junction type solar battery produced according to the first preferred embodiment of the present invention, showing the essential parts thereof for explanatory purposes.

Reference is now made to FIG. 2, which is a sectional view of an example of the semiconductor device used as a p-n junction type solar battery and produced by the above process according to the present invention, showing its essential part for the explanatory purpose. Description will be hereinafter made of a process for forming such a solar battery according to the present invention with reference to FIG. 2.

In FIG. 2, the reference numeral 15 designates a film or sheet type substrate made of various organic materials such as polyimide and Mylar, inorganic insulating materials such as glass and ceramics, or metals. Using a process similar to the above-mentioned ionized-cluster-beam process, a metallic film layer, which can provide an ohmic contact with a semiconductor film layer to be subsequently depostied thereon, is deposited on the upper surface of the substrate 15 to form a substrate terminal electrode 16. Then, a p-n junction type semiconductor element film 13 formed by the above-mentioned process and consisting of a p-type silicon film layer 17 and an n-type silicon film layer 18 integrally laminated, is fixedly bonded to the substrate terminal electrode 16 in a laminated manner by, for instance, heating so that it can form an ohmic contact with the electrode 16. In this case, the p-type silicon film layer 17 and then-type silicon film layer 18 may be laminated in the reverse order, as a matter of course. Then a metallic film, which can provide an ohmic contact with the p-n junction type semiconductor element film 18, is mounted on the upper surface of the semiconductor element film 18 to form an opposite terminal electrode 19. Metallic film layers formed as the above-mentioned substrate terminal electrode 16 and the opposite terminal electrode 19 are preferably made of a metal containing, e.g., aluminum and indium when the semiconductor to be in contact therewith is p-type silicon, and a metal containing, for instance, antimony when the semiconductor is n-type silicon. The silicon film layer formed by the ionized-cluster-beam deposition process shows very good crystallinity, since the acceleration energy of the ionized clusters is partly converted into thermal energy when the ionized clusters impinge on the substrate; and, in addition, can be heat processed at a temperature far lower than that applied in the case of any conventional process in order to obtain a sufficient ohmic contact with the metallic film layer coming into contact therewith. Then an anti-reflector film layer 20 is coated on the upper surface of the semiconductor film layer, and is preferably made of zinc sulfide or the like.

Thus a thin film p-n junction type semiconductor device 22 very high in quality and usable as a solar battery can be formed.

In each stage mentioned above in which the ionized-cluster-beam deposition process is carried out, it is just a matter of course that the processing conditions such as substrate temperature, intensity of electron current for ionization and acceleration voltage for ionized clusters be properly selected so that each deposited film layer may be optimized in adhesion, strength, etc.

As mentioned above, the substrate of the thin p-n junction type semiconductor device, i.e., solar battery is preferably made of thin-sheet or flexible-film type organic materials such as Mylar and polyimide, thin-sheet inorganic materials such as glass and ceramics, or thin-sheet metals.

The anti-reflection film layer 20 shown in the above embodiment functions as a light-receiving surface for effectively absorbing rays incident thereon from the outside, and is coated on the upper surface of the p-n junction type semiconductor device, i.e., solar battery by the above-mentioned ionized-cluster-beam deposition process or other suitable methods. Instead of providing the anti-reflection film layer 20, the opposite terminal electrode 19 may be formed so that it can perform the function of the anti-reflection film layer concurrently.

The substrate used for forming the above mentioned p-n junction type semiconductor film and p-n junction type semiconductor film layers may be other than rock salt e.g., sodium bromide and the like. Therefore, if the material of the substrate is suitably selected, single-crystal film layers of various substances other than silicon such as elemental semiconductors and compound semiconductors can be formed thereon, as a matter of course.

Figure 3:
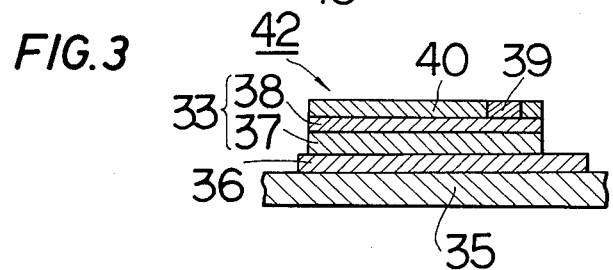
FIG. 3 is sectional view of an example of a semi-conductor device, i.e., the Schottky barrier type solar battery produced according to the second preferred embodiment of the present invention, showing the essential parts thereof for explanatory purposes.

Reference is now made to FIG. 3, which is a sectional side view of an example of a semiconductor device used as a Schottky barrier type solar battery and produced according to the second embodiment of the present invention.

In FIG. 3, the reference numeral 35 designates a substrate formed of a film or a thin sheet made of various organic substances such as polyimide and Mylar, or a thin sheet made of inorganic substances such as glass and metal. On the upper surface of substrate 35, there is coated a metallic film layer, which can provide an ohmic contact with a semiconductor film layer to be subsequently formed thereon, by the ionized-cluster-beam deposition process as referred to in the above-mentioned first embodiment with reference to FIG. 1 to form a substrate terminal electrode 36. Then, a Schottky barrier type laminated element film 33, which consists of a p-type or n-type semiconductor film layer 37 and a Schottky barrier type metallic film layer 38 integrally laminated with the latter on top of the former and formed according to processes for forming a laminated element film and laminated element film layers applied in the above-mentioned first embodiment, is placed on the substrate terminal electrode 36 and is fixedly coated thereon in a laminated manner so that it can come into ohmic contact with the substrate terminal electrode 36. Furthermore, an opposite terminal electrode 39 having a suitable shape such as comb shape or wire shape for collecting electric current is fixedly provided on the upper surface of the metallic film 38, and an anti-reflection film layer 40 is also provided on the upper surface of the metallic film 38.

In the above-mentioned second embodiment, the Schottky barrier type laminated element film 33 fixedly provided on the substrate terminal electrode 36 formed on the substrate 35 is shown, by way of example, as provided with the semiconductor film layer 37 at the substrate side and with the metallic film layer 38 at the upper side, i.e., the light-receiving side. However, the order of these film layers is not limited to this example, and may be reversed. In other words, the metallic film layer of the above-mentioned Schottky barrier type laminated element film may be fixed on the substrate terminal electrode formed on the substrate with the semiconductor film layer upside, i.e., at the light-receiving side, and the opposite terminal electrode may be provided on the semiconductor film layer. In this case, the opposite terminal electrode coated on the semiconductor film layer is made of such a metal that can obtain an ohmic contact with the semiconductor, and may be formed by the above-mentioned ionized-cluster-beam deposition process.

The metallic film layer of the substrate terminal electrode 36 in the above-mentioned second embodiment is preferably made of a metal containing, for instance, such elements as aluminum and indium when the semiconductor film layer 37 coming into contact therewith is p-type silicon, and a metal containing, for instance, such elements as antimony when the semiconductor 37 is n-type silicon.

The semiconductor film layer 37, when it is made of p-type silicon, contains an impurity chosen from aluminum and indium; and when it is made of n-type silicon, it contains an impurity chosen from antimony, phosphorus and arsenic. As mentioned above, the contact surface between this semiconductor film layer 37 and the substrate terminal electrode 36 is an ohmic contact.

The Schottky-barrier-forming metallic film layer 38 provided on the semiconductor film layer 37 is made of a metal whose work function is greater than the Fermi energy of the semiconductor, for instance, gold, chromium, etc., or is formed of a complex layer of these metals.

The anti-reflection film layer 40 is preferably made of zinc sulfide or the like.

By using the ionized-cluster-beam deposition process, the semiconductor film layer 37 shows excellent crystallinity and the Schottky-barrier-forming metallic film layer 38 provides an excellent Schottky barrier, since, when ionized clusters impinge on the depositing surface, the acceleration energy thereof is partly converted into thermal energy. Furthermore, in the thermal processing for bonding the semiconductor film layer 37 of the Schottky barrier type laminated element film 33 to the substrate terminal electrode 36 provided on the substrate 36, sufficient ohmic contact can be provided therebetween at a processing temperature far lower than that applied in the case of a conventional method.

In this manner, a Schottky barrier type semiconductor device 42 used as a thin film Schottky barrier type solar battery and very high in quality can be produced.

In the above description of the second embodiment, detailed description was omitted at the portions common to those of the description of the first embodiment by using common terms or expressions.

It will be understood from the foregoing description that the method of producing a semiconductor device according to the present invention includes steps for forming and separating out, a p-n junction type semiconductor film or a laminated element film consisting of Schottky barrier type element film layers, constituting the essential part of the semiconductor device, which are carried out by a novel and excellent technique having the steps of producing ionized clusters of the materials for the films, accelerating the ionized clusters to let them impinge on a deposition substrate thereby to consecutively and integrally form element film layers of the film in a laminated manner while controlling the crystalline properties by the crystal axis of the material of the substrate, and separating the film by dissolving the substrate in a suitable solvent. Therefore, the method of the present invention has the following advantageous features and effects:

1. Since the surface of the deposition substrate on which the laminated element film is deposited or that of the p-type or n-type semiconductor film layer or that of the metallic film layer is at all times kept clean by the sputter-cleaning action due to impingement of the ionized clusters during deposition, the laminated element film can be made almost free of defects due to impurities, high in quality and very thin. Therefore, a high-quality and sufficiently thin semiconductor device used as a solar battery can be produced.

2. Since the deposition process of the present invention accelerates the ionized clusters with a suitable high energy high-voltage applied electric field it can produce what is called the self-heating effect of the surface of the depositing film layer which creates a local temperature rise due to partial conversion of the kinetic energy of the ionized clusters into thermal energy when the ionized clusters impinge on the substrate, and also it can produce what is called the migration effect which breaks up the ionized and non-ionized clusters into individual atomic particles and spreads them over the surface of the depositing film layer by the energy they have at the time of impact. Therefore, the deposition process of the present invention can achieve excellent crystal growth of the depositing material.

Furthermore, the method of the present invention applies the above deposition process to the cleavage plane of a substrate material, and thereby it can achieve a crystal growth of the depositing film whose crystalline properties are well controlled.

Accordingly, the method of the present invention can easily produce a high-quality thin semiconductor device, e.g., a solar battery having excellent crystalline properties.

3. The laminated element film formed on the deposition substrate by the crystal growth thereon can be easily separated from the deposition substrate without any deformation and deterioration of the crystal structure by dissolving the deposition substrate in water or other various solvents. Therefore, production of the thin semiconductor device, e.g., a solar battery using this laminated element film can be made much easier.

4. The thicknesses of the p-type silicon film layer, n-type silicon film layer and metallic film layer constituting the laminated element film can be controlled by properly adjusting the processing conditions of the ionized-cluster-beam deposition process, and therefore the silicon layer or metal layer positioned outside the p-n junction plane or the Schottky barrier junction plane can be made thinner than in the case of the prior art and thereby the wavelength sensitivity range for incident rays can be widened.

5. In the prior art, the above-mentioned junction plane is usually formed by diffusing impurities from the surface of the silicon, and therefore a high concentration diffusion region, where recombination of holes and electrons frequently occurs, prevails in the vicinity of the surface. Accordingly, in the prior art, charged particles produced by radiation of rays cannot be effectively separated by the junction. On the other hand, the method of the present invention can control the concentration of impurities during deposition, and therefore can eliminate the above disadvantage of the prior art.

6. In the above-mentioned embodiments, description was made of the case where silicon was used as the semiconductor. However, the semiconductors that can be used in this invention are not limited to silicon. Besides silicon, this invention can use other elemental semiconductors and compound semiconductors such as Ge, GaAs, InP and CdTe to produce high-quality thin semiconductor devices used as solar batteries. When a compound semiconductor is used, the compound semiconductor itself is not necessarily required to be placed in the closed type crucible; suitably mixed component elements of the compound semiconductor may be placed therein.

7. If both or either one of the substrate terminal electrode and the opposite terminal electrode are formed on the respective deposition surfaces by the ionized-cluster-beam deposition process, a further higher quality semiconductor device of this kind can be efficiently produced.

Obviously, numerous modifications and variations of the present invention are possible in light of the above teachings. It is therefore to be understood that within the scope of the appended claims, the invention may be practiced otherwise than as specifically described.

What is claimed as new and desired to be secured by Letters Patent of the United States is:

1. A method of producing a semiconductor device comprising the sequential steps of:
    providing a substrate made of a material easy to cleave and easy to dissolve in a preselected solvent so that film layers having excellent crystalline properties and oriented by the crystal axis of the substrate may be made to grow on a cleavage plane of said substrate;
    vaporizing a first material-to-be-deposited to form a first vapor;
    injecting said first vapor into a vacuum region which is at most $10^{-2}$ Torr and at about 1/100 or less of the pressure of said first vapor to form aggregates of atoms of said first vapor called first clusters;
    bombarding said first clusters with electrons to ionize at least a part of said first clusters thereby forming ionized first clusters;
    accelerating said ionized first clusters by an electric field to bring them into collision with said substrate thereby forming a first crystalline film layer thereon;
    vaporizing a second material-to-be-deposited to form a second vapor;
    injecting said second vapor into a vacuum region which is at most $10^{-2}$ Torr and at about 1/100 or less of the pressure of said second vapor to form aggregates of atoms of said second vapor called second clusters;
    bombarding said second clusters with electrons to ionize at least a part of said second clusters thereby forming ionized second clusters;
    accelerating said ionized second clusters by an electric field to bring them into collision with said first crystalline film layer to form a second crystalline film layer thereon, thereby forming a laminated element film portion of said device;
    separating said laminated element film portion from said substrate by dissolving the substrate material in said preselected solvent; and
    furnishing said laminated element film with suitable electrodes to form said semiconductor device.

2. The method of producing a semiconductor device recited in claim 1 wherein the first material-to-be-deposited is a semiconductor of one conductivity type and the second material-to-be-deposited is a semiconductor of the opposite conductivity type.

3. The method of producing a semiconductor device recited in claim 1 wherein the electrodes comprise first and second metallic film layers deposited on the first and second crystalline film layers respectively.

4. The method of producing a semiconductor device recited in claim 1 wherein the first material-to-be-deposited is a semiconductor of one conductivity type and the second material-to-be-deposited is a metal capable of forming a Schottky barrier with said semiconductor.

5. A method of producing a semiconductor device comprising the sequential steps of:
    providing a substrate made of a material easy to cleave and easy to dissolve in a preselected solvent so that film layers having excellent crystalline properties and oriented by the crystal of axis of the substrate may be made to grow on a cleavage plane of said substrate;
    vaporizing a first, metallic material-to-be-deposited to form a first vapor;
    injecting said first vapor into a vacuum region which is at most $10^{-2}$ Torr and at about 1/100 or less of the pressure of said first vapor to form aggregates of atoms of said first vapor called first clusters;
    bombarding said first clusters with electrons to ionize at least a part of said first clusters thereby forming ionized first clusters;
    accelerating said ionized first clusters by an electric field to bring them into collision with said substrate thereby forming a first, metallic film layer thereon for a terminal electrode;
    vaporizing a second material-to-be-deposited to form a second vapor;
    injecting said second vapor into a vuccum region which is at most $10^{-2}$ Torr and at about 1/100 or less of the pressure of said second vapor to form aggregates of atoms of said second vapor called second clusters;

bombarding said second clusters with electrons to ionize at least a part of said second clusters thereby forming ionized second clusters;

accelerating said ionized second clusters by an electric field to bring them into collision with said first metallic film layer thereby forming a second crystalline film layer thereon;

vaporizing a third material-to-be-deposited to form a third vapor;

injecting said third vapor into a vacuum region which is at most $10^{-2}$ Torr and at about 1/100 or less of the pressure of said third vapor to form aggregates of atoms of said third vapor called third clusters;

bombarding said third clusters with electrons to ionize at least a part of said third clusters thereby forming ionized third clusters;

accelerating said ionized third clusters by an electric field to bring them into collision with said second crystalline film layers to form a third crystalline film layer thereon;

vaporizing a fourth, metallic material-to-be-deposited to form a fourth vapor;

injecting said fourth vapor into a vacuum region which is at most $10^{-2}$ Torr and at about 1/100 or less of the pressure of said fourth vapor to form aggregates of atoms of said fourth vapor called fourth clusters;

bombarding said fourth clusters with electrons to ionize at least a part of said fourth clusters thereby forming ionized fourth clusters;

accelerating said ionized fourth clusters by an electric field to bring them into collision with said third crystalline film layers to form a fourth, metallic film layer for an opposite terminal electrode thereon thereby forming a laminated element film; and separating said laminated element film from said substrate by dissolving the substrate material in said preselected solvent.

6. The method of producing a semiconductor device recited in claim 5 wherein the second material-to-be-deposited is a semiconductor of one conductivity type and the third material-to-be-deposited is a semiconductor of the opposite conductivity type.

7. The method of producing a semiconductor device recited in claim 5 wherein the second material-to-be-deposited is a semiconductor of one conductivity type and the third material-to-be-deposited is a metal capable of forming a Schottky barrier with said semiconductor.

8. A method of producing a semiconductor device comprising the sequential steps of:

providing a first substrate made of a material easy to cleave and easy to dissolve in a preselected solvent so that film layers having excellent crystalline properties and oriented by the crystal axis of said first substrate may be made to grow on a cleavage plane of said first substrate;

vaporizing a semiconductor of one conductivity type to form a first vapor;

injecting said first vapor into a vacuum region which is at most $10^{-2}$ Torr and at about 1/100 or less of the pressure of said first vapor to form aggregates of atoms of said first vapor called first clusters;

bombarding said first clusters with electrons to ionize at least a part of said first clusters thereby forming ionized first clusters;

accelerating said ionized first clusters by an electric field to bring them into collision with said first substrate thereby forming a first crystalline film layer thereon;

vaporizing a semiconductor of opposite conductivity type to form a second vapor;

injecting said second vapor into a vacuum region which is at most $10^{-2}$ Torr and at about 1/100 or less of the pressure of said second vapor to form aggregates of atoms of said second vapor called second clusters;

bombarding said second clusters with electrons to ionize at least a part of said second clusters thereby forming ionized second clusters;

accelerating said ionized second clusters by an electric field to bring them into collision with said first crystalline film layer to form a second crystalline film layer thereon, thereby forming a p-n junction type laminated element film portion of said device;

separating said laminated element film portion from said first substrate by dissolving the substrate material in said preselected solvent;

providing a second substrate;

depositing a first metallic film layer on said second substrate to form a substrate terminal electrode;

mounting said first crystalline film layer on said first metallic film layer so as to establish an ohmic contact therewith; and depositing a second metallic film layer on said second crystalline film layer to form an opposite terminal electrode.

9. The method of producing a semiconductor device recited in claim 8 wherein the step of depositing said first metallic film layer on said second substrate comprises the steps of vaporizing a first metallic film material to form a third vapor, injecting said third vapor into a vacuum reion which is at most $10^{-2}$ Torr and about 1/100 less of the pressure of said third vapor to form aggregates of atoms of said third vapor called third clusters, bombarding said third clusters with electrons to ionize at least a part of said third clusters thereby forming ionized third clusters, and accelerating said ionized third clusters by an electric field to bring them into collision with said second substrate thereby forming a first metallic film layer thereon.

10. The method of producing a semiconductor device recited in claim 8 wherein the step of depositing said second metallic film layer on said second crystalline film layer comprises the steps of vaporizing a second metallic film material to form a third vapor, injecting said third vapor into a vacuum region which is at most $10^{-2}$ Torr and about 1/100 or less of the pressure of said third vapor to form aggregates of atoms of said third vapor called third clusters, bombarding said third clusters with electrons to ionize at least a part of said third clusters thereby forming ionized third clusters, and accelerating said ionized third clusters by an electric field to bring them into collision with said second crystalline film layer thereby forming a second metallic film layer thereon so as to establish an ohmic contact therewith.

11. A method of producing a semiconductor device comprising the sequential steps of:

providing a first substrate made of a material easy to cleave and easy to dissolve in a preselected solvent so that film layers having excellent crystalline properties and oriented by the crystal axis of said first substrate may be made to grow on a cleavage plane of said first substrate;

vaporizing a semiconductor of one type of conductivity to form a first vapor;

injecting said first vapor into a vacuum region which is at most $10^{-2}$ Torr and at about 1/100 or less of the pressure of said first vapor to form aggregates of atoms of said first vapor called first clusters;

bombarding said first clusters with electrons to ionize at least a part of said first clusters thereby forming ionized first clusters;

accelerating said ionized first clusters by an electric field to bring them into collision with said first substrate thereby forming a first crystalline film layer thereon;

vaporizing a metal capable of forming a Schottky barrier with said semiconductor to form a second vapor;

injecting said second vapor into a vacuum region which is at most $10^{-2}$ Torr and at about 1/100 or less of the pressure of said second vapor to form aggregates of atoms of said second vapor called second clusters;

bombarding said second clusters with electrons to ionize at least a part of said second clusters thereby forming ionized second clusters;

accelerating said ionized second clusters by an electric field to bring them into collision with said first crystalline film layer to form a first metallic film layer thereon, thereby forming a Schottky barrier type laminated element film portion of said device, separating said laminated element film from said first substrate by dissolving the substrate material in said preselected solvent;

providing a second substrate;

depositing a second metallic film layer on said second substrate to form a substrate terminal electrode;

mounting said first crystalline film layer on said second metallic film layer; and depositing a third metallic film layer on said first metallic film layer to form an opposite terminal electrode.

12. The method of producing a semiconductor device recited in claim 1 wherein the step of depositing said second metallic film layer on said second substrate comprises the steps of vaporising a second metallic film material to form a third vapor, injecting said third vapor into a vacuum region which is at most $10^{-2}$ Torr and about 1/100 or less of the pressure of said third vapor to form aggregates of atoms of said third vapor called third clusters, bombarding said third clusters with electrons to ionize at least a part of said third clusters thereby forming ionized third clusters, and accelerating said ionized third clusters by an electric field to bring them into collision with said second substrate thereby forming a second metallic film thereon so as to establish an ohmic contact with said first crystalline film layer to be subsequently deposited thereon.

13. A method of producing a semiconductor device comprising the sequential steps of:

providing a first substrate made of a material easy to cleave and easy to dissolve in a preselected solvent so that film layers having excellent crystalline properties and oriented by the crystal axis of said first substrate may be made to grow on a cleavage plane of said first substrate;

vaporizing a semiconductor of one type of conductivity to form a first vapor;

injecting said first vapor into a vacuum region which is at most $10^{-2}$ Torr and at about 1/100 or less of the pressure of said first vapor to form aggregates of atoms of said first vapor called first clusters;

bombarding said first clusters with electrons to ionize at least a part of said first clusters thereby forming ionized first clusters;

accelerating said ionized first clusters by an electric field to bring them into collision with said first substrate thereby forming a first crystalline film layer thereon;

vaporizing a metal capable of forming a Schottky barrier with said semiconductor to form a second vapor;

injecting said second vapor into a vacuum region which is at most $10^{-2}$ Torr and at about 1/100 or less of the pressure of said second vapor to form aggregates of atoms of said second vapor called second clusters;

bombarding said second clusters with electrons to ionize at least a part of said second clusters thereby forming ionized second clusters;

accelerating said ionized second clusters by an electric field to bring them into collision with said first crystalline film layer to form a first metallic film layer thereon, thereby forming a Schottky barrier type laminated element film portion of said device, separating said laminated element flim portion from said first substrate by dissolving the substrate material in said preselected solvent;

providing a second substrate;

depositing a second metallic film layer on said second substrate to form a substrate terminal electrode;

mounting said first metallic film layer on said second metallic film layer; and depositing a third metallic film layer on said first crystalline film layer to form an opposite terminal electrode.

14. The method of producing a semiconductor device recited in claim 13 wherein the step of depositing said second metallic film layer on said second substrate comprises the steps of vaporizing a second metallic film material to form a third vapor, injecting said third vapor into a vacuum region which is at most $10^{-2}$ Torr and at about 1/100 or less of the pressure of said third vapor to form aggregates of atoms of said third vapor called third clusters, bombarding said third clusters with electrons to ionize at least a part of said third clusters thereby forming ionized third clusters, and accelerating said ionized third clusters by an electric field to bring them into collision with said second substrate thereby forming a second metallic film thereon so as to establish an ohmic contact with said first crystalline film layer to be subsequently deposited thereon.

* * * * *